(12) United States Patent
Pilolli et al.

(10) Patent No.: US 9,189,440 B2
(45) Date of Patent: Nov. 17, 2015

(54) DATA INTERLEAVING MODULE

(71) Applicant: Micron Technology, Inc., Boise, ID (US)

(72) Inventors: Luigi Pilolli, L'Aquila (IT); Maria-Luisa Gallese, Avezzano (IT); Mauro Castelli, Padua (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/330,076

(22) Filed: Jul. 14, 2014

(65) Prior Publication Data

US 2015/0019787 A1     Jan. 15, 2015

Related U.S. Application Data

(63) Continuation of application No. 13/562,536, filed on Jul. 31, 2012, now Pat. No. 8,804,452.

(51) Int. Cl.
| | |
|---|---|
| *G11C 7/10* | (2006.01) |
| *G06F 13/40* | (2006.01) |
| *G06F 12/06* | (2006.01) |
| *G11C 11/56* | (2006.01) |

(52) U.S. Cl.
CPC ........ *G06F 13/4027* (2013.01); *G06F 12/0607* (2013.01); *G11C 11/5628* (2013.01); *G06F 2212/254* (2013.01); *G11C 11/56* (2013.01); *G11C 11/5621* (2013.01); *Y02B 60/1225* (2013.01)

(58) Field of Classification Search
CPC ...... G11C 7/10; G11C 11/5628; G11C 11/56; G06F 13/4027; G06F 12/0607; G06F 2212/254; Y02B 60/1225

USPC ............ 365/230.02, 185.03, 185.11, 189.02, 365/189.16, 189.17
See application file for complete search history.

(56) References Cited

U.S. PATENT DOCUMENTS

| | | |
|---|---|---|
| 4,992,979 A | 2/1991 | Aichelman et al. |
| 5,093,809 A | 3/1992 | Schmitt-Landsiedel et al. |
| 5,969,986 A | 10/1999 | Wong et al. |
| 6,097,637 A | 8/2000 | Bauer et al. |
| 6,282,627 B1 | 8/2001 | Wong et al. |
| 6,282,927 B1 | 9/2001 | Wunderlich et al. |
| 6,535,422 B2 | 3/2003 | Goto et al. |
| 7,460,398 B1 | 12/2008 | Roohparvar et al. |

(Continued)

FOREIGN PATENT DOCUMENTS

| | | |
|---|---|---|
| WO | 2009060185 | 5/2009 |
| WO | 2011153000 | 12/2011 |

OTHER PUBLICATIONS

Hong, et al., "NAND Flash-based Disk Cache Using SLC/MLC Combined Flash Memory," Research Paper, May 2010, pp. 21-30.

(Continued)

*Primary Examiner* — Tan T. Nguyen
(74) *Attorney, Agent, or Firm* — Brooks, Cameron & Huebsch, PLLC

(57) ABSTRACT

The present disclosure includes apparatuses and methods related to a data interleaving module. A number of methods can include interleaving data received from a bus among modules according to a selected one of a plurality of data densities per memory cell supported by an apparatus and transferring the interleaved data from the modules to a register.

20 Claims, 6 Drawing Sheets

(56) References Cited

U.S. PATENT DOCUMENTS

| | | |
|---|---|---|
| 7,934,074 B2 | 4/2011 | Lee et al. |
| 8,078,794 B2 | 12/2011 | Lee et al. |
| 8,082,382 B2 | 12/2011 | Roohparvar |
| 8,111,550 B2 | 2/2012 | Sarin et al. |
| 8,804,452 B2 * | 8/2014 | Pilolli et al. ............. 365/230.02 |
| 2004/0162931 A1 | 8/2004 | Hwang et al. |
| 2007/0165457 A1 * | 7/2007 | Kim ........................ 365/185.11 |
| 2007/0180346 A1 | 8/2007 | Murin |
| 2008/0172520 A1 | 7/2008 | Lee |
| 2008/0198651 A1 | 8/2008 | Kim |
| 2009/0187701 A1 | 7/2009 | Kim |
| 2009/0248952 A1 | 10/2009 | Radke et al. |
| 2010/0115176 A1 | 5/2010 | Sarin et al. |
| 2010/0122016 A1 | 5/2010 | Marotta et al. |
| 2010/0146229 A1 | 6/2010 | Yang et al. |
| 2010/0269016 A1 * | 10/2010 | Ware ............................ 714/763 |
| 2011/0314204 A1 * | 12/2011 | Ootsuka et al. ............... 711/103 |
| 2012/0069657 A1 | 3/2012 | Choi et al. |
| 2012/0102379 A1 | 4/2012 | D'Abreu |

OTHER PUBLICATIONS

Im, et al., "Storage Architecture and Software Support for SLC/MLC Combined Flash Memory," Research Paper, Mar. 8-12, 2009, pp. 1664-1669.

Thomas, et al., "Multi-grained Reconfigurable Datapath Structures for Online-Adaptive Reconfigurable Hardware Architechtures," Research Paper, May 11-12, 2005, 6 pages.

Lanuzza, et al., "Low-Cost Fully Reconfigurable Data-Path for FPGA-Based Multimedia Processor," Research Paper, Aug. 21-26, 2005, pp. 13-18.

Notification of International Search Report and Written Opinion of related international patent application No. PCT/US2013/052009, dated Nov. 8, 2013, 11 pages.

Office Action for related Taiwan Patent Application No. 102127290, dated Apr. 21, 2015, 7 pages.

* cited by examiner

DATA INTERLEAVING MODULE

PRIORITY INFORMATION

This application is a Continuation of U.S. application Ser. No. 13/562,536, filed on Jul. 31, 2012, which is incorporated herein by reference.

TECHNICAL FIELD

The present disclosure relates generally to semiconductor memory and methods, and more particularly, to apparatuses and methods related to a data interleaving module.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Flash memory devices can include a charge storage structure, such as is included in floating gate flash devices and charge trap flash (CTF) devices, which may be utilized as non-volatile memory for a wide range of electronic applications. Flash memory devices may use a one-transistor memory cell that allows for high memory densities, high reliability, and low power consumption.

Memory cells in an array architecture can be programmed to a target charge storage state. For example, electric charge can be placed on or removed from the floating gate of a memory cell to put the cell into one of a number of charge storage states. For example, a single level cell (SLC) can be programmed to one of two charge storage states representing one of two units of data (e.g., 1 or 0). Multilevel memory cells (MLCs) can be programmed to one of more than two charge storage states. For example, an MLC capable of storing two units of data can be programmed to one of four charge storage states, an MLC capable of storing three units of data can be programmed to one of eight charge storage states, and an MLC capable of storing four units of data can be programmed to one of sixteen charge storage states. MLCs can allow the manufacture of higher density memories without increasing the number of memory cells since each cell can represent more than one unit of data (e.g., more than one bit). Some memory devices may support both SLC and MLC operation and/or different MLC data densities. Such a wide range of operation can have an adverse effect on data-path design.

DETAILED DESCRIPTION

Figure 1:
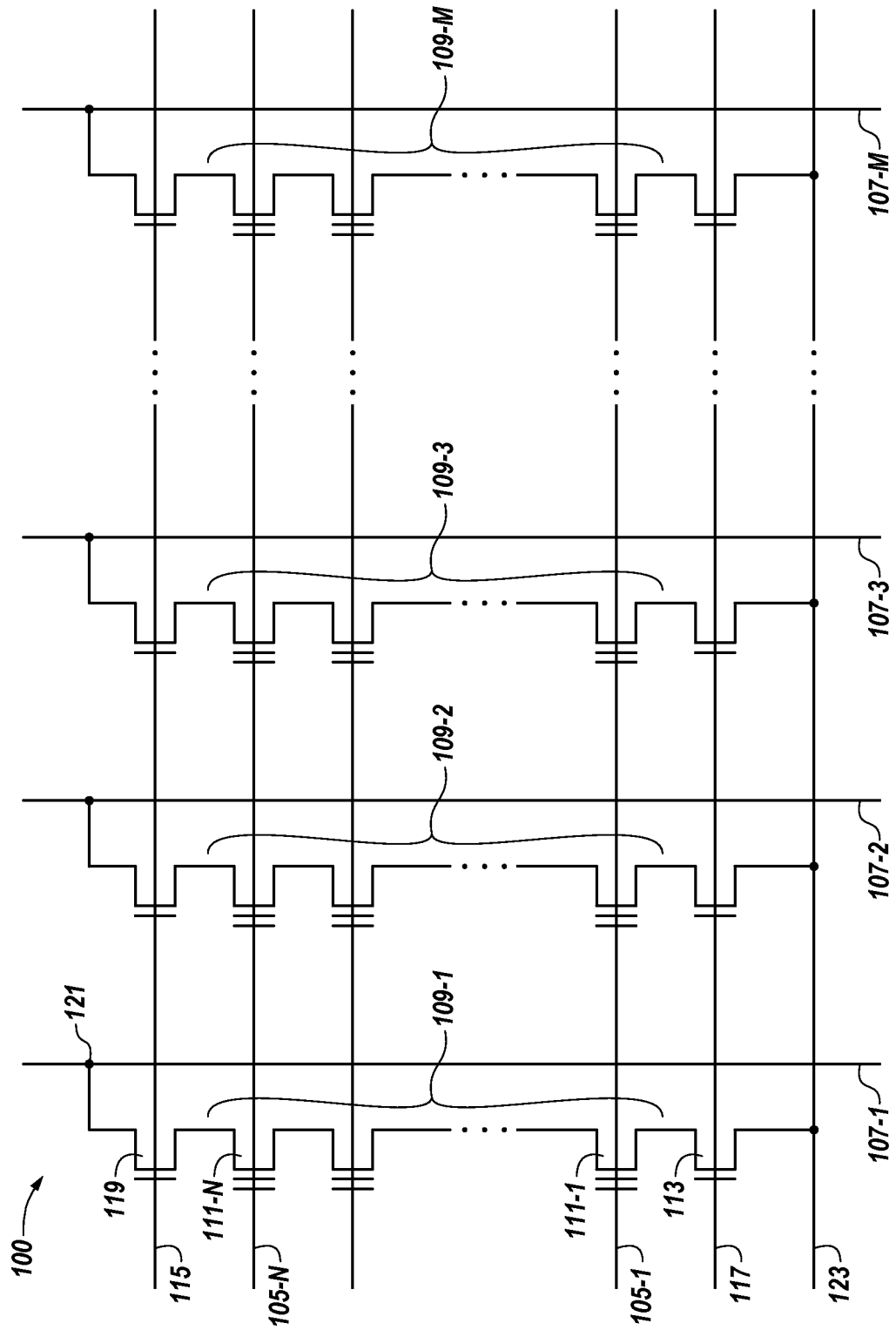
FIG. 1 illustrates a schematic diagram of a portion of a non-volatile memory array in accordance with a number of embodiments of the present disclosure.

The present disclosure includes apparatuses and methods related to a data interleaving module. A number of methods can include interleaving data received from a bus among modules according to a selected one of a plurality of data densities per memory cell supported by an apparatus and transferring the interleaved data from the modules to a register. Interleaving data among modules between a bus and a register can allow a memory device to support different memory densities (e.g., numbers of bits per memory cell) and maintain data alignment without using a different data-path specific to each respective memory density supported by the memory device, or having an overly complicated data-path design to support multiple memory densities.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "N", "M", "P", and "W", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines 105-1, ..., 105-N) and intersecting data lines (e.g., local bit lines 107-1, 107-2, 107-3, ..., 107-M). For ease of addressing in the digital environment, the number of word lines 105-1, ..., 105-N and the number of local bit lines 107-1, 107-2, 107-3, ..., 107-M can be some power of two (e.g., 256 word lines by 4,096 bit lines).

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a local bit line 107-1, 107-2, 107-3, ..., 107-M. The memory cells 111-1, ..., 111-N of each NAND string 109-1, 109-2, 109-3, ..., 109-M are connected in series source to drain between a source select gate (SGS) (e.g., a field-effect transistor (FET) 113) and a drain select gate (SGD) (e.g., FET 119). Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of the non-volatile memory cells 111-1, ..., 111-N includes a source, a drain, a floating gate or other charge storage structure, and a control gate. The memory cells 111-1, ..., 111-N have their control gates coupled to a word line, 105-1, ..., 105-N, respectively. A NOR array architecture would be similarly laid out, except that the string of memory cells would be coupled in parallel between the select gates. Furthermore, a NOR architecture can provide for random access (e.g., sensing) to the memory cells in the array (e.g., as opposed to page-based access as with a NAND architecture).

A number (e.g., a subset or all) of cells coupled to a selected word line (e.g., 105-1, ..., 105-N) can be programmed and/or sensed (e.g., read) together as a group. A number of cells programmed and/or sensed together can correspond to a page of data. In association with a sensing operation, a number of cells coupled to a particular word line and programmed together to respective charge storage states can be referred to as a target page. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a targeted charge storage state.

A sensing operation, such as a read or program verify operation, can include sensing a voltage and/or current change of a bit line coupled to a selected cell in order to determine the charge storage state of the selected cell. The sensing operation can include precharging a bit line and sensing the discharge when a selected cell begins to conduct.

Sensing the charge storage state of a selected cell can include providing a number of sensing signals (e.g., read voltages) to a selected word line while providing a number of voltages (e.g., read pass voltages) to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing signal applied to the selected word line. For example, the charge storage state of a selected cell can be determined by the word line voltage at which the bit line current reaches a particular reference current associated with a particular state.

Figure 2:
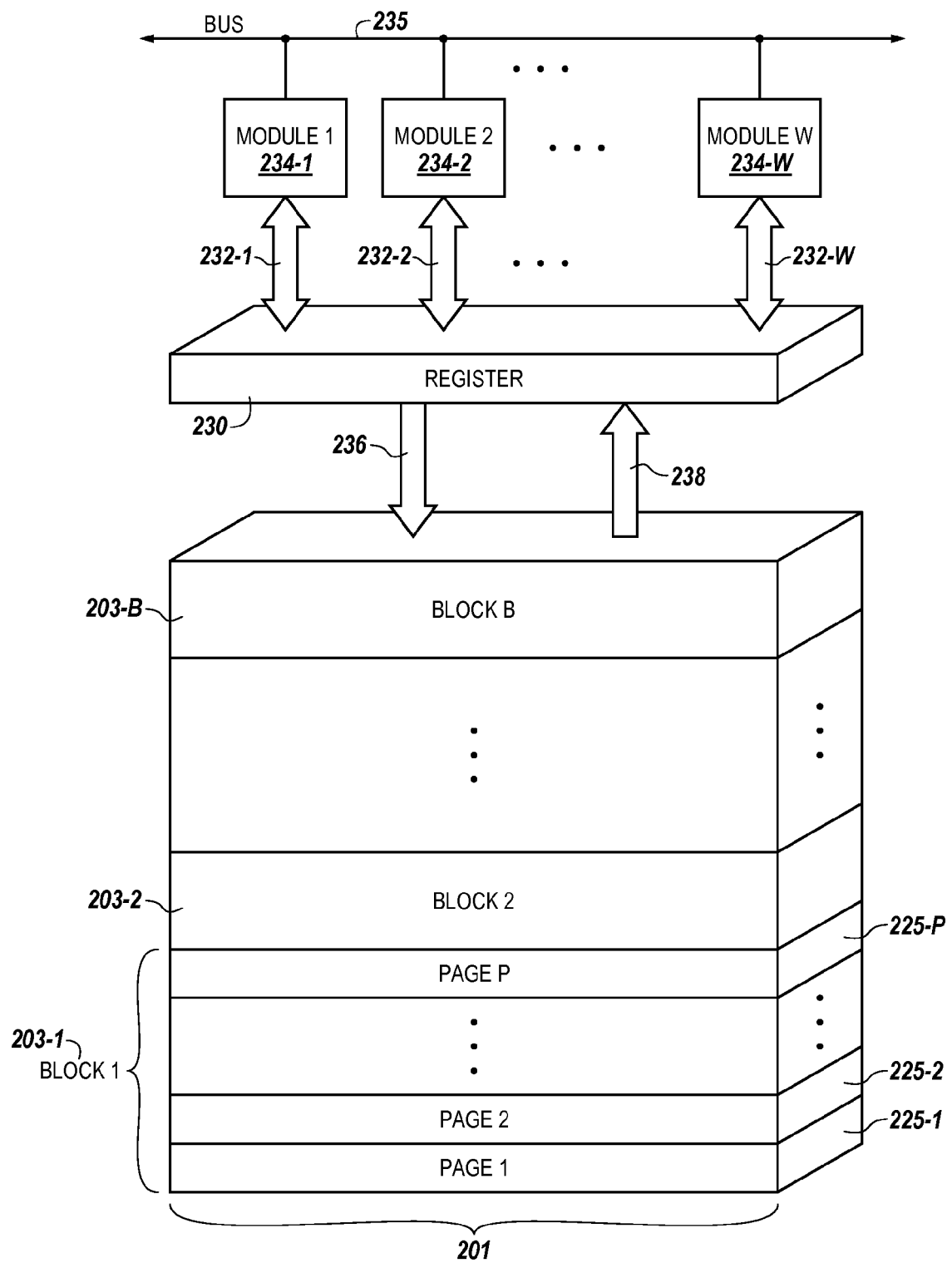
FIG. 2 illustrates a block diagram of a memory architecture in accordance with a number of embodiments of the present disclosure.

FIG. 2 illustrates a block diagram of a memory architecture in accordance with a number of embodiments of the present disclosure. As used herein, a memory system, a controller, a memory device, an array, and/or circuitry, might also be separately considered an "apparatus." The embodiment of FIG. 2 illustrates a number of pages, 225-1, 225-2, ..., 225-P, included in Block 1, 203-1. FIG. 2 also illustrates a number of blocks 203-1, 203-2, ..., 203-B. According to the embodiment illustrated in FIG. 2, blocks 203-1, 203-2, ..., 203-B together are included in plane 201. Embodiments are not limited to memory devices including one plane, as memory devices may include one plane or more than one plane. The plane 201 can include a number of memory arrays (e.g., memory array 100 illustrated in FIG. 1). As an example, a 128 GB memory device can include 27,888 bytes of data per page, 256 pages per block, 1381 blocks per plane, and two planes per device.

Plane 201 is shown in bidirectional communication with a register 230 (e.g., a memory page register, a strobe register, etc.) at 236 and 238. In some embodiments, the register 230 can store an amount of data equal to a page size of the memory device. Data can be transferred from register 230 to the memory plane 201 at 236 during write operations. Data can also be transferred from the memory plane 201 to the register 230 during read operations. Data can be transferred from the register 230 to a bus 235 and/or to the register 230 from the bus 235, via a plurality of interfaces 232-1, 232-2, ..., 232-W (e.g., ways), and a corresponding plurality of modules 234-1, 234-2, ..., 234-W. The register 230 can be divided into a plurality of portions corresponding to the plurality of interfaces 232-1, 232-2, ..., 232-W and/or modules 234-1, 234-2, ..., 234-W. The bus 235 can be connected to input/output (I/O) circuitry (e.g., I/O circuitry 660 in FIG. 6).

Data can be transferred between the register 230 and the bus 235 through a number of data cycles. By way of example, a page of data (e.g., eight kilobytes (kB) of data) can be loaded into register 230 through a number of 4 byte data cycles (e.g., where four bytes is the width of the data transfer). For example, the interfaces 232-1, 232-2, ..., 232-W between the modules 234-1, 234-2, ..., 234-W and the register 230 can each include a number of regions (e.g., four regions) and a number of data lines (e.g., eight data lines) per region. Embodiments are not limited to memory devices including a particular page size, data cycle width, number of regions per module, or number of data lines per region. The modules 234-1, 234-2, ..., 234-W are described in more detail with respect to FIG. 4. As the reader will appreciate, a partial page of data can be transferred to and/or from register 230.

A memory device can be configured to support (e.g., program and/or read) different memory densities per memory cell (e.g., one-bit, two-bits, three-bits, 1.5-bits, 2.25-bits, etc.). In some embodiments, one device can support multiple different memory densities and a particular operating memory density can be selected (e.g., via an input to a controller of the memory device as described herein).

For write operations, the memory device can be configured to interleave data from the bus 235 among the modules 234-1, 234-2, . . . , 234-W according to a selected one of the data densities per memory cell supported by the memory device. The data can be interleaved such that a unit of the data (e.g., a bit, a byte, etc.) received from the bus 235 is interleaved to only one of the modules 234-1, 234-2, . . . , 234-W. Then, the interleaved data can be transferred to the register 230 for programming to the plane 201. In some embodiments, the modules 234-1, 234-2, . . . , 234-W can be configured to transfer interleaved data to the register 230 simultaneously. For example, during a particular clock cycle, each of the modules 234-1, 234-2, . . . , 234-W can transfer interleaved data to the register 230.

In a number of embodiments, the memory device can be configured to output data from a particular memory cell in the plane 201 with a configurable data quantization. Soft data associated with a memory cell can indicate a location of a threshold voltage (Vt) of the memory cell within a Vt distribution representing the target state to which the memory cell was programmed. Additionally, soft data associated with a memory cell can indicate a probability of whether the Vt of the memory cell corresponds to the target state to which the memory cell was programmed. In contrast, data that corresponds to the data state a memory cell is determined to be in by a sensing operation can be referred to as hard data. A configurable data quantization allows the memory device to adjust how much hard and/or soft data is output from a particular memory cell. Such embodiments can be useful to reduce I/O traffic as compared to always outputting all available hard and/or soft data.

For read operations, the memory device can be configured to deinterleave data from the register 230 via the modules 234-1, 234-2, . . . , 234-W according to a selected one of the data densities per memory cell supported by the memory device. Then, the deinterleaved data can be transferred to the bus 235. Additional detail on interleaving and deinterleaving data according to a selected memory density is provided herein, and in particular with respect to FIG. 5.

Although FIG. 2 illustrates only one register 230 in association with the plane 201, embodiments are not so limited. In some embodiments, a plane 201 can include more than one register, such as a data register and a cache register as described in more detail with respect to FIG. 3.

Figure 3:
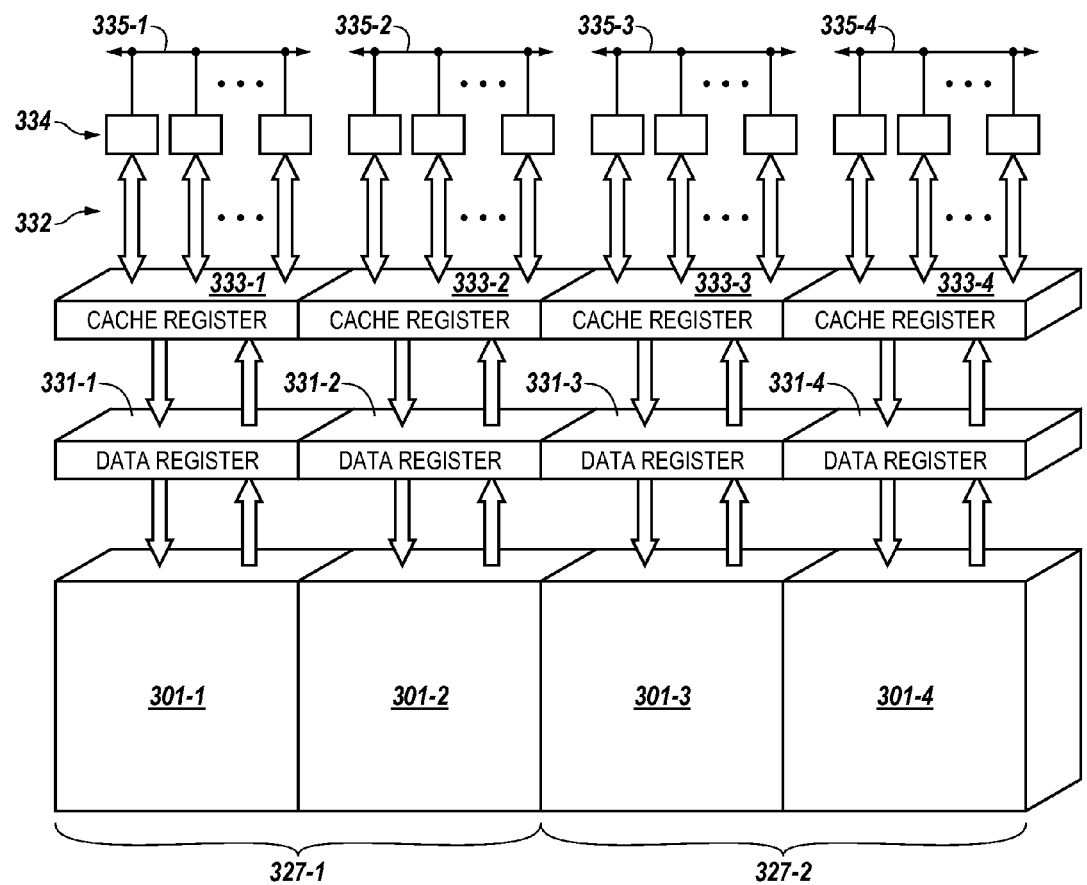
FIG. 3 illustrates a block diagram of a memory architecture in accordance with a number of embodiments of the present disclosure.

FIG. 3 illustrates a block diagram of a memory architecture in accordance with a number of embodiments of the present disclosure. FIG. 3 includes two memory dies 327-1 and 327-2 with two planes each, 301-1, 301-2, 301-3, and 301-4. Each plane is in bidirectional communication with a data register 331-1, 331-2, 331-3, and 331-4 respectively. Each data register is in bidirectional communication with a cache register 333-1, 333-2, 333-3, and 333-4 respectively. Each register can function substantially as described above with respect to FIG. 2.

Using a cache register for reading operations can allow pipelining a next sequential access from the array while outputting previously-accessed data. Such a double-buffered technique can allow read access time to be "hidden." Data can be first transferred from a memory array to the data register. If the cache register is available (not busy), the data can be moved from the data register to the cache register. Once the data is transferred to the cache register, the data register is available and can start to load the next sequential page from the memory array.

Using a cache register for programming operations can provide a performance improvement versus non-cached programming operations. Such a double-buffered technique can allow a controller to input data directly to the cache register and use the data register as a holding register to supply data for programming to the array. Such a method can free the cache register so that a next page operation can be loaded in parallel. In some applications, the programming time can be completely "hidden." The data register can maintain data through the programming cycle. Such a method can free up the cache register so that it can start receiving the next page of data from the controller.

In the embodiment illustrated in FIG. 3, plane 301-1 can represent half of the blocks on die 327-1, while plane 301-2 can represent the other half. Plane 301-3 can represent half of the blocks on die 327-2, while plane 301-4 can represent the other half. In one or more embodiments, planes can be divided between odd and even numbered blocks. In one or more embodiments, an "odd" or "even" block of data can be a logical representation of data where data units from half (the "odd" numbered) of the memory cells coupled to access lines associated with the block are stored in an "odd" block and data units from the other half (the "even" numbered) of the memory cells coupled to access lines associated with the block are stored in an "even" block. Embodiments are not limited to a particular plane representing half of the blocks on a given die having more than one plane; other distributions of blocks between planes are possible. Nor are embodiments limited to memory devices with a particular number of blocks, planes, or dies.

Each cache register 333-1, 333-2, 333-3, 333-4 can be coupled to modules 334 by interfaces 332, analogous to the arrangement illustrated in FIG. 2. The modules 334 associated with each cache register 333-1, 333-2, 333-3, 333-4 can be coupled to respective buses 335-1, 335-2, 335-3, 335-4. In some embodiments, each bus 335-1, 335-2, 335-3, 335-4 can be a discrete bus. In a number of embodiments, each bus 335-1, 335-2, 335-3, 335-4 can represent a segment of a common bus. Various other combinations of buses can be arranged. For example, bus 335-1 and bus 335-2 associated with plane die 327-1 can be a common bus separate from a common bus comprising bus 335-3 and bus 335-4 associated with die 327-2.

Figure 4:
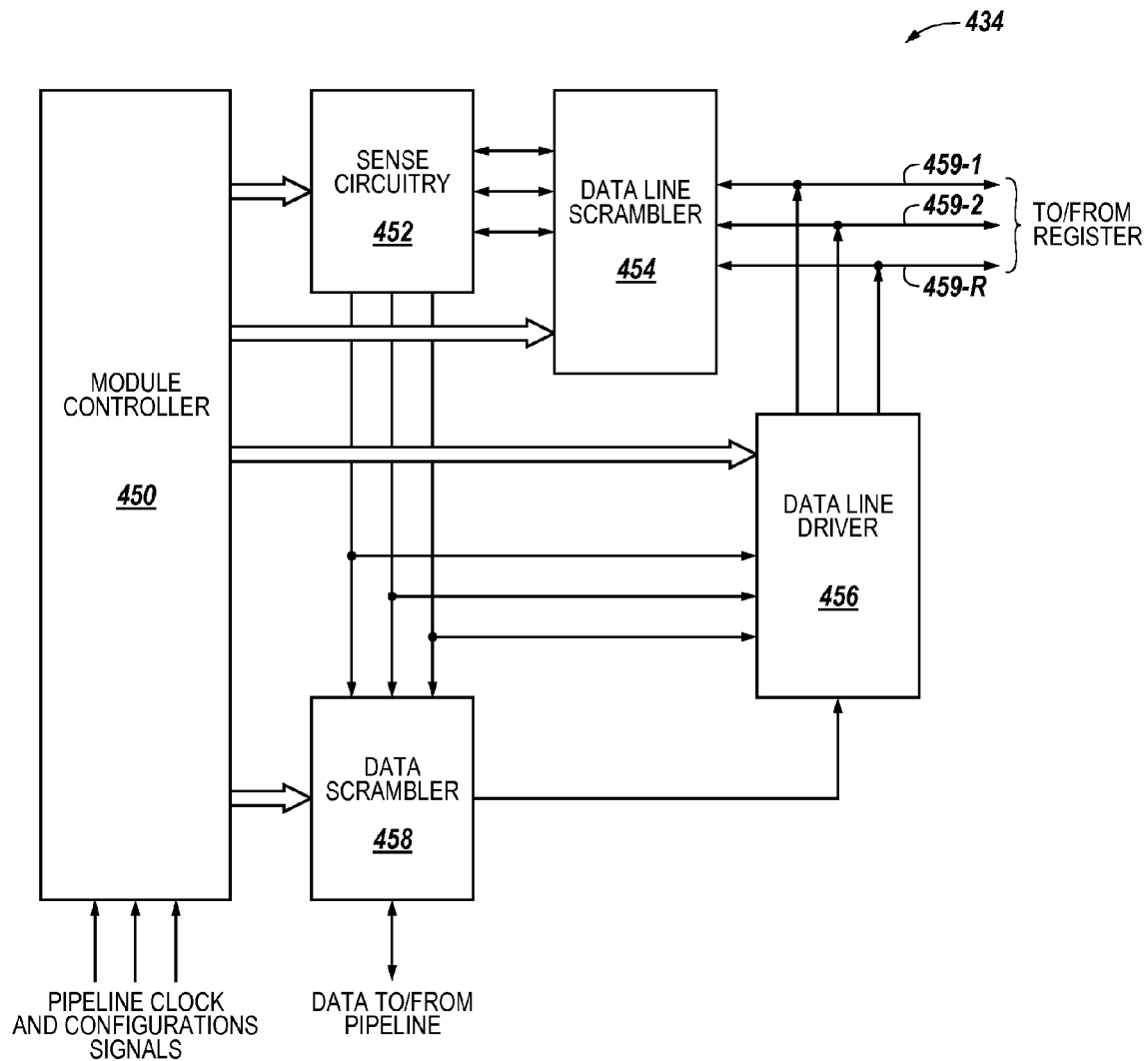
FIG. 4 illustrates a block diagram of a module in accordance with a number of embodiments of the present disclosure.

FIG. 4 illustrates a block diagram of a module 434 in accordance with a number of embodiments of the present disclosure. The module 434, which can be analogous to modules 234-1, 234-2, . . . , 234-W illustrated in FIG. 2, can include a module controller 450. The module controller 450 can receive input from a bus (e.g., a pipelined bus) including clock signals and configuration signals, among others. For example, the module controller 450 can receive a signal (e.g., from the bus) selecting one of a plurality of data densities per memory cell, as described herein. The module controller 450 can direct operation of the module 434 including the sense circuitry 452, data line scrambler 454, data line driver 456, and/or data scrambler 458 (e.g., via the control connections illustrated in FIG. 4).

The sense circuitry 452 can be coupled between the data line scrambler 454 and the data scrambler 458. The sense circuitry 452 can be configured to sense data from the regions 459-1, 459-2, . . . , 459-R (e.g., as received via the data line scrambler 454) and to send the data to the data scrambler 458.

The data line scrambler 454 can be coupled to the module controller 450, to the sense circuitry 452, and to a number of regions 459-1, 459-2, . . . , 459-R to provide a connection to a register (e.g., register 230 illustrated in FIG. 2). In some embodiments, each module 434 can include four regions 459-1, 459-2, . . . , 459-R, however embodiments are not so limited, as a module 434 can include any number of regions 459-1, 459-2, . . . , 459-R. The module controller 450 can cause the data line scrambler 454 to receive data from the register via the regions 459-1, 459-2, . . . , 459-R.

The module 434 (e.g., by direction of the module controller 450) can be configured to transfer data (e.g., interleaved and/or deinterleaved data) via regions 459-1, 459-2, ..., 459-R to a register (e.g., to a respective portion of a register). The module 434 can transfer interleaved data in parallel via regions 459-1, 459-2, ..., 459-R. In some embodiments, the module 434 can be configured to transfer a particular number of bytes (e.g., one byte, two bytes, etc.) of interleaved data per regions 459-1, 459-2, ..., 459-R per data cycle. The number of regions 459-1, 459-2, ..., 459-R can correspond 1:1 to the number of bytes of data that can be transferred in parallel (e.g., a module 434 can include and/or utilize four regions and transfer one byte from each region in parallel for a total of four bytes). As such, each region 459-1, 459-2, ..., 459-R can include a plurality of data lines (e.g., eight data lines). The module controller 450 can be configured to control different numbers of the of the regions 459-1, 459-2, ..., 459-R according to different selected data densities. For example, it may be more efficient to utilize less than all of the regions 459-1, 459-2, ..., 459-R of a given module 434 for transferring data depending on a selected data density.

The data line driver 456 can be coupled to the data scrambler 458 and to the regions 459-1, 459-2, ..., 459-R. The data line driver can receive control signals from the module controller 450 to direct operation thereof. The data line driver can receive input from the sense circuitry 452 (e.g., to aid in determining when data has been successfully transferred to the register via the regions 459-1, 459-2, ..., 459-R). The data line driver 456 (e.g., by direction of the control module 450) can be responsible for providing electrical charge to the data lines associated with the regions 459-1, 459-2, ..., 459-R for transferring data between the module 434 and the register.

The data scrambler 458 can provide a connection to a bus (e.g., bus 235 illustrated in FIG. 2). The module controller 450 can cause the data scrambler 458 to interleave data from the bus and/or deinterleave data (e.g., from the regions 459-1, 459-2, ..., 459-R) according to the selected data density. The data scrambler 458 can be coupled to the regions 459-1, 459-2, ..., 459-R via a data line driver 456. The module controller 450 can be configured to cause the data scrambler 458 to send data (e.g., interleaved data) to the data line driver 456. Then, the module controller 450 can cause the data line driver 456 to transfer respective portions of the interleaved data via each of the number of regions 459-1, 459-2, ..., 459-R.

Figure 5:
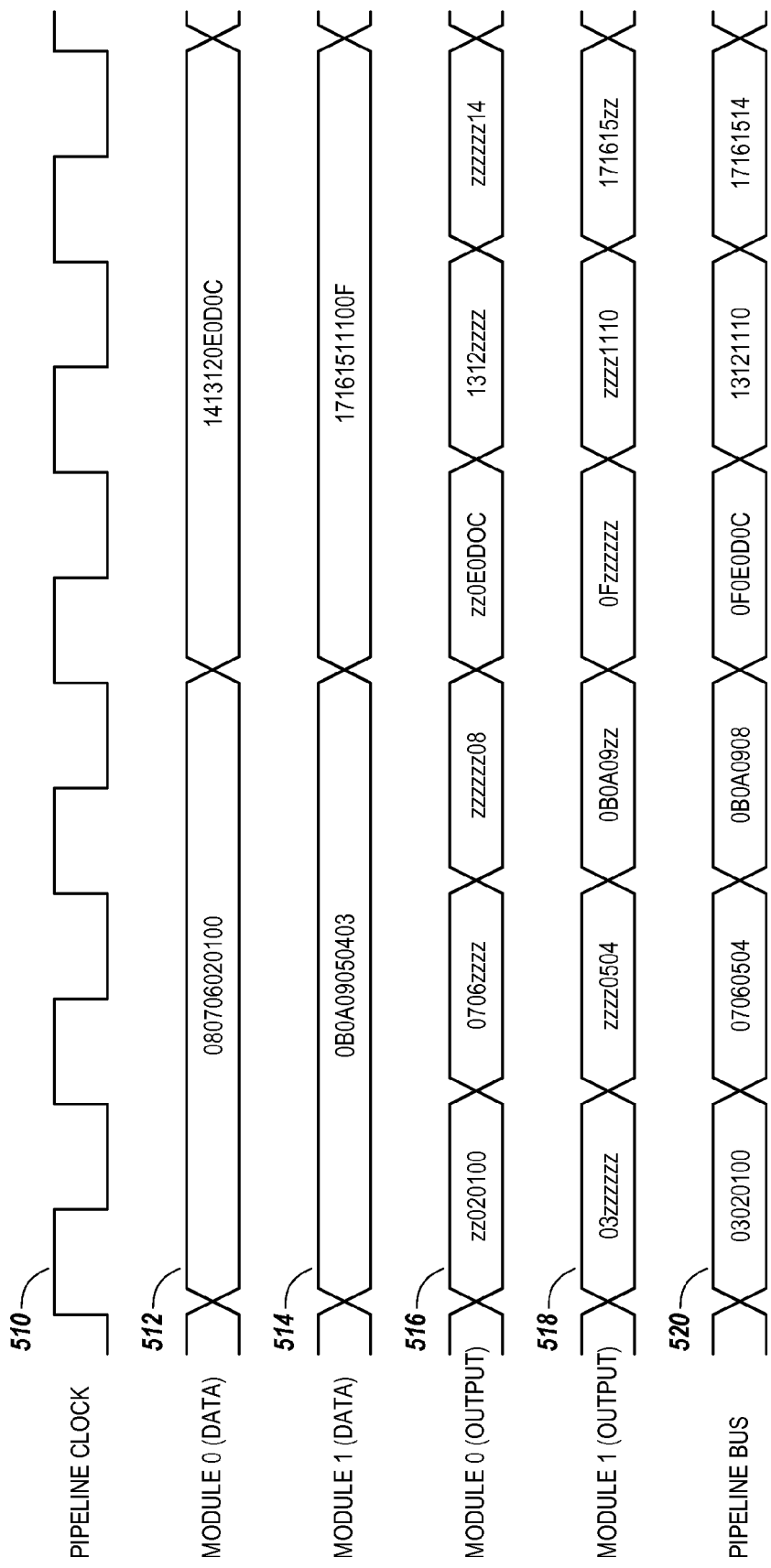
FIG. 5 illustrates a timing diagram for data interleaving and/or deinterleaving in accordance with a number of embodiments of the present disclosure.

FIG. 5 illustrates a timing diagram for data interleaving and/or deinterleaving in accordance with a number of embodiments of the present disclosure. The timing diagram includes representations of a clock signal for a bus (e.g., "PIPELINE CLOCK" 510), interleaved data associated with a first module (e.g., "MODULE 0 (DATA)" 512), interleaved data associated with a second module (e.g., "MODULE 1 (DATA)" 514), data being interleaved and/or deinterleaved in the first module (e.g., "MODULE 0 (OUTPUT)" 516), data being interleaved and/or deinterleaved in the second module (e.g., "MODULE 1 (OUTPUT)" 518), and deinterleaved data associated with the bus (e.g., "PIPELINE BUS" 520). By way of example, the specific interleaving and/or deinterleaving of data illustrated in FIG. 5 can be for a memory device (e.g., a plane in a memory device) operated with two modules and four regions per module for a selected data density of three bits per cell using a bus that transfers four bytes per clock cycle, however embodiments are not limited to this example, which is included to explain the details of one particular implementation to facilitate understanding of the broader concepts.

The pipeline clock signal illustrated at 510 indicates that a rising edge of the clock signal is associated with a closing of a previous data window and an opening of a new data window for interleaving and/or deinterleaving data in each module as illustrated at 516 and 518 and associated with the pipeline bus as illustrated at 520. However, embodiments are not limited to this convention.

In each data window in FIG. 5, the data order is from right to left (e.g., the first unit is on the right). Thus, for example, in the first data window associated with the pipeline bus 520, the first data is "0" followed by "0" followed by "1" and so on. However, the data windows proceed in order from left to right. Thus, for example, the "first" data window at 516 includes "zz020100", the "second" includes "0706zzzz", etc. Thus, when the data for module 0 is interleaved from its illustration at 516 to its illustration at 512, the data is ordered from right to left starting with the units illustrated in the first window of 516 (written here in right-to-left order) "001020" followed by the units from the second window "6070" followed by the units from the third window "08" for a collective "001020607080" at 512.

The "z" characters in the data indicate a break in data for a particular module for a particular clock cycle for timing purposes. For example, data from the first data window of the pipeline bus 520 (written here right-to-left) "00102030" during interleaving can be represented as (written here right-to-left) "001020zz" in the first module at 516 and as (written here right-to-left) "zzzzzz30" is the second module at 518. In other words, the first six units of data can be interleaved to the first module at 516 and the last two units of data can be interleaved to the second module at 518. The data illustrated in FIG. 5 is written in hexadecimal notation, thus each unit of the data represents four bits, or, perhaps more clearly, two units represent one byte. This provides a helpful illustration of how data can be interleaved according to a selected data density per memory cell (e.g., as FIG. 5 is drawn to an embodiment using three bits per memory cell, the first three bytes from the pipeline bus at 520 are interleaved to the first module at 516 and the next byte is interleaved to the second module at 518 and the "z" characters indicate breaks in the data to maintain ordering according to the clock cycle). When the data from the first three clock cycles for the first module at 516 is interleaved to the first module as illustrated at 512, the breaks (e.g., "z" characters) are not included. The data illustrated for the first module at 512 and for the second module at 514 can be an order of the data that is transferred to and/or from a register (e.g., where the first and second module can transfer data with first and second portions of a register respectively). Thus, the data illustrated for the first module at 512 and for the second module at 514 can be in a same order stored in memory cells of a memory device in some embodiments). Thus, the memory device can be configured to include breaks in the data during interleaving and/or deinterleaving to maintain ordering according to a selected data density per memory cell. The ordering maintained can be considered either an ordering expected by the pipeline bus (for a host such as host 604 illustrated in FIG. 6) (e.g., for deinterleaving) or an ordering in which the data is stored in the memory (e.g., for interleaving).

In the example illustrated in FIG. 5, there are four regions per module and two modules per register (e.g., per data register), there are three bits stored per memory cell, and the bus handles four bytes per clock cycle. Thus, each data window illustrated for the bus at 520 includes eight units (four bytes). In some embodiments, one byte of data (e.g., hard and/or soft data) can be output from a memory cell regardless of the number of bits of hard data stored therein.

Use of the modules can be selectively enabled and/or disabled. As described herein, use of the modules allows for data ordering to be maintained for the different selected data densities per memory cell supported by the memory device. However, the memory device may operate using threshold voltage (Vt) placer mode or using data placer mode. Vt placer mode includes the use of the modules. Data placer mode does not include use of the modules. Thus, the memory device can selectively disable the modules to transition from Vt placer mode to data placer mode, or selectively enable the modules to transfer from data placer mode to Vt placer mode. Data placer mode can include programming a memory cell to a target programmed state via a multi-page programming operation (e.g., at least one lower page and at least one upper page) and/or sensing a programmed state of a memory cell in a multi-page sensing operation. In contrast, Vt placer mode can include programming a memory cell to target programmed state directly (e.g., not using a multi-page operation) and/or sensing a memory cell directly (e.g., not using a multi-page operation). Vt placer mode can include the use of a configurable data quantization, as described herein. Whether the modules are selectively disabled, the data-path of the memory device (e.g., between bus and register) can be a same data-path with the exception that the data-path and/or ordering are not modified by the modules when they are disabled. In other words, when the modules are disabled, data can pass-thru the modules and, for example, therefore the data ordering is not altered by the modules.

As used herein, deinterleaving can be a reverse and/or opposite process with respect to interleaving. The following discussion with respect to FIG. 5 addresses interleaving first and then deinterleaving second to aid understanding.

Data received from a bus (e.g., as illustrated at 520) can be interleaved among different modules according to a selected data density per memory cell. Amounts of the data received from the bus corresponding to the selected data density can be transferred to respective modules (e.g., as illustrated at 516 and 512 for module 0 and at 518 and 514 for module 1). For example, a first amount of the data can be transferred from the bus to a particular module during a first clock cycle (e.g., where (written here from right-to-left) "30" (one byte) is transferred to module 1 as illustrated at 518) and a second amount of the data can be transferred from the bus to the particular module during a second clock cycle (e.g., where (written here from right-to-left) "4050" (two bytes) is transferred to module 1 in the second clock cycle as illustrated at 518). A third amount of data can be transferred from the bus to another module during the first clock cycle (e.g., where (written here from right-to-left) "001020" (three bytes) is transferred to module 0 as illustrated at 516). The first and second amounts collectively can correspond to the selected data density (e.g., three bits per cell in this example). The third amount can correspond to the selected data density alone. In this example, correspondence to the selected data density exists because three bytes is proportional to three bits (at a ratio of 1 B:1 b). In other examples (not illustrated), correspondence could exist because the amounts could be equal to the selected data density.

Data can be received from a number of portions of a register with a corresponding number of modules (e.g., as illustrated at 512 and 514). The received data can be deinterleaved with the modules according to a selected data density per memory cell. Deinterleaving the data can include timing an output of the data from each module to a bus shared by the modules such that an amount of data corresponding to the selected data density is output from each module in turn. For example, as illustrated at 512 and 516, (written here from right-to-left) data "001020" in the first module is followed by breaks "zz" while, during the same clock cycle, as illustrated at 514 and 518, (written here from right-to-left) data "30" is preceded by breaks "zzzzzz." As described above, "001020" can represent three bytes, which can correspond to the selected data density of three bits per cell. During the first clock cycle, only "30" is transferred from the second module to the bus, which can represent one byte, however (written here from right-to-left) "4050" is transferred from the second module during the second clock cycle, which collectively with "30" represents three bytes, which corresponds to the selected data density of 3 bits per cell, and as such, in turn, an amount of data corresponding to the selected data density is output from each module.

Data can be transferred from the first module and the second module to the bus during a same clock cycle as illustrated at 516, 518, and 520, where (written here from right-to-left) "001020" is transferred from module 0 and (written here from right-to-left) "30" is transferred from module 1 to the bus during the first clock cycle. Thus, an amount of data corresponding to the selected data density (e.g., three bytes corresponds to three bits per cell) can be transferred from one module to the bus during a same clock cycle that an amount of data not corresponding to the selected data density (e.g., one byte does not correspond to three bits per cell) is transferred from another module to the bus.

During a same number of clock cycles (e.g., three clock cycles in this example) an amount of data can be transferred from each module to the bus, the amount corresponding to the selected data density. For example, during the first three clock cycles illustrated in FIG. 5, six bytes is transferred from each module to the bus. Six bytes can correspond to three bits per cell because six bytes is two times three bytes and three bytes corresponds 1B:1b to three bits per cell as described above. Any multiple of B also corresponds according to the 1B:1b correspondence (e.g., three bytes, six bytes, nine bytes, etc. for three bits per cell).

Although a number of embodiments operated with two modules and four regions per module for a selected data density of three bits per cell are illustrated and described with respect to FIG. 5, one of ordinary skill in the art, having read and understood the present disclosure, can implement a number of embodiments of the present disclosure with different operating parameters (e.g., a different selected memory density, a different number of modules, and/or a different number of regions per module).

Figure 6:
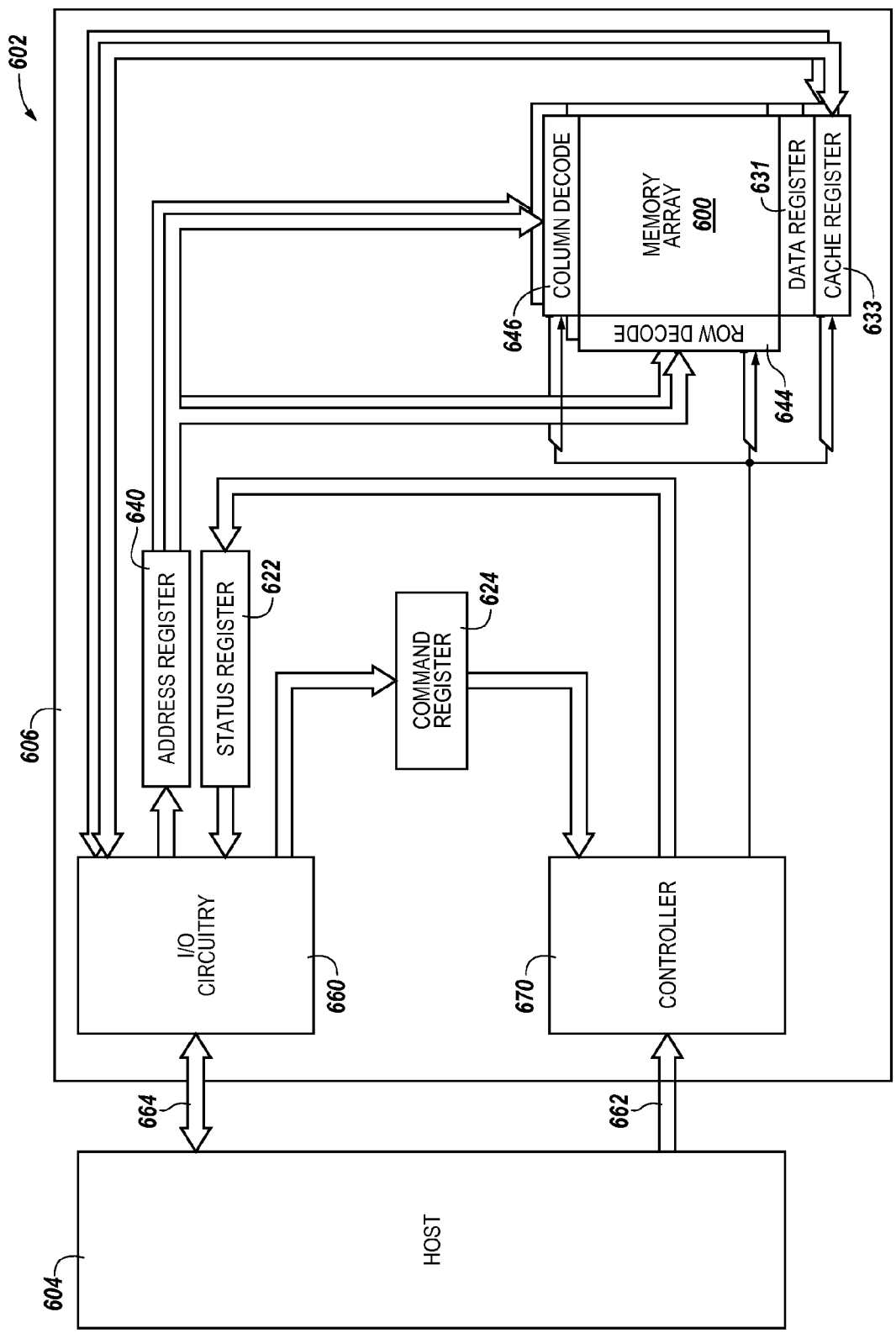
FIG. 6 illustrates a block diagram of a memory apparatus operated in accordance with a number of embodiments of the present disclosure.

FIG. 6 illustrates a block diagram of a memory apparatus 602 operated in accordance with a number of embodiments of the present disclosure. The memory apparatus 602 can include a host circuitry 604, e.g., a processor, a computing device including a number of processors, an application specific integrated circuit (ASIC), etc., coupled to a memory device 606, e.g., to a memory controller 670 of the memory device 606. The memory controller 670 and/or various components thereof can be on a same die as a memory array 600, can be on a different die than the memory array 600, but in a same module, or can be in a memory system, e.g., a solid state drive, which includes such a memory module/die. The memory device 606 can include the memory array 600. Although one memory array 600 is shown in FIG. 6, embodiments of the present disclosure are not so limited, e.g., the memory device 606 can include more than one memory array 600.

The memory array 600 of memory cells can be floating gate flash memory cells with a NAND architecture, for example. The memory device 606 can include address circuitry (e.g., address register 640) to latch address signals provided over I/O connections 664 through I/O circuitry 660. Address signals can be received and decoded by a row decoder 644 and a column decoder 646 to access the memory array 600. The number of address input connections depends on the density and architecture of the memory array 600 and that the number of addresses increases with both increased numbers of memory cells and increased numbers of memory blocks and arrays.

The controller 670 can load status information into a status register 622, which can further communicate status information to the I/O circuitry 660. Commands received by I/O circuitry 660 can be latched by a command register 624 and transferred to the controller 670 for generating internal signals to control memory device operations. The controller 670 can read data in the memory array 600 by sensing voltage and/or current changes in the memory array columns using sensing circuitry. The controller 670 can read and latch a page, e.g., a row, of data from the memory array 600. I/O circuitry 660 is included for bi-directional data communication over the I/O connections 664 with the host circuitry 604.

The controller 670 can decode signals provided by control connections 662 from the host circuitry 604. These signals can include chip signals, write enable signals, and address latch signals that are used to control the operations on the memory array 600, including data read, data write, and data erase operations, as described herein. According to a number of embodiments of the present disclosure, the apparatus 602 can receive a signal indicating a selected one of a number of configured data densities per memory cell from the host 604. The control connections 662 and the I/O connections 664 can be collectively referred to as a host interface coupling the controller 670 to the host circuitry 604. In a number of embodiments, the controller 670 is responsible for executing instructions from the host circuitry 604 to perform the operations according to embodiments of the present disclosure. The controller 670 can be a state machine, a sequencer, control circuitry, or some other type of controller. It will be appreciated by those skilled in the art that additional circuitry and control signals can be provided, and that the memory device detail of FIG. 6 has been reduced to facilitate ease of illustration.

Although not specifically illustrated in FIG. 6, the modules (e.g., modules 234-1, 234-2, . . . , 234-W illustrated in FIG. 2) can be coupled between the cache register 633 and the I/O circuitry 660. Furthermore, while not specifically illustrated, the module controllers (e.g., module controller 450 illustrated in FIG. 4) can interface with the controller 670 and/or the I/O circuitry to exchange clock and/or control signals, among other information as described herein.

CONCLUSION

The present disclosure includes apparatuses and methods related to a data interleaving module. A number of methods can include interleaving data received from a bus among modules according to a selected one of a plurality of data densities per memory cell supported by an apparatus and transferring the interleaved data from the modules to a register.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a register;
   a plurality of modules coupled to the register; and
   a bus coupled to the plurality of modules;
   wherein the apparatus is configured to:
      transfer amounts of the data corresponding to the selected one of the plurality of data densities to respective modules according to a selected one of a plurality of densities per memory cell; and
      transfer the data from the respective modules to the register.

2. The apparatus of claim 1, wherein the apparatus is configured to interleave the data among the plurality of modules such that a unit of the data received from the bus is interleaved to only one of the plurality of modules.

3. The apparatus of claim 2, wherein the plurality of modules are configured to transfer the interleaved data to the register simultaneously.

4. The apparatus of claim 3, wherein the plurality of modules are each coupled to the register by a respective number of regions.

5. The apparatus of claim 4, wherein the number of regions comprises a number of regions greater than one, and wherein each of the plurality of modules is configured to transfer the interleaved data to the register in parallel by the respective number of regions.

6. The apparatus of claim 5, wherein each of the plurality of modules is configured to transfer one byte of the interleaved data per region per data cycle.

7. The apparatus of claim 6, wherein the apparatus is configured to output data from a particular memory cell with a configurable data quantization.

8. The apparatus of claim 7, wherein the apparatus is configured to program a plurality of memory cells with a configurable data density per memory cell.

9. An apparatus, comprising:
   a bus coupled to a plurality of modules;
   a register including a plurality of portions corresponding to the plurality of modules, wherein the register is coupled to the bus by the plurality of modules;
   wherein each of the plurality of modules is configured to receive data from a respective one of the plurality of portions of the register; and
   wherein the apparatus is configured to transfer the data from each of the plurality of modules to the bus such that an amount of data corresponding to the selected data density is output from each of the plurality of modules.

10. The apparatus of claim 9, wherein each of the plurality of modules includes sensing circuitry and wherein each of the plurality of modules is configured to sense the data from the respective one of the plurality of portions of the register.

11. The apparatus of claim 9, wherein the apparatus is configured to selectively enable the plurality of modules to transition from data placer mode to threshold voltage (Vt) placer mode.

12. The apparatus of claim 9, wherein the apparatus is configured to receive a signal indicating the selected one of the plurality of configured data densities per memory cell.

13. An apparatus, comprising:
a module controller coupled to:
a data scrambler to provide a connection to a bus; and
a number of regions to provide a connection to a register;
wherein the module controller is configured to:
cause the data scrambler to interleave amounts of data from the bus according to a selected data density; and
transfer the interleaved data via the plurality of regions.

14. The apparatus of claim 13, wherein the number of regions correspond 1:1 to a number of bytes of data that can be transferred in parallel.

15. The apparatus of claim 14, wherein the data scrambler is coupled to the number of regions via a data line driver, and wherein the module controller is configured to cause the data scrambler to send the interleaved data to a data line driver.

16. The apparatus of claim 15, wherein the module controller is configured to cause the data line driver to transfer respective portions of the interleaved data via each of the number of regions.

17. The apparatus of claim 14, wherein the module controller is configured to control different numbers of the number of regions according to different selected data densities.

18. The apparatus of claim 17, wherein the number of regions comprises four and wherein each region includes eight data lines.

19. The apparatus of claim 13, wherein the module controller is configured to receive a signal indicating the configured data density from the bus.

20. The apparatus of claim 13, wherein the module controller is configured to cause the data scrambler to transfer an amount of data corresponding to the selected data density to the bus during a plurality of clock cycles.

* * * * *